United States Patent
Wenzel et al.

(10) Patent No.: US 7,418,055 B2
(45) Date of Patent: Aug. 26, 2008

(54) DEVICE AND METHOD FOR REGULATING THE OUTPUT POWER OF MOBILE

(75) Inventors: Dietmar Wenzel, München (DE); Robert Würth, München (DE)

(73) Assignee: Infineon Technologies AG, Munich (DE)

(*) Notice: Subject to any disclaimer, the term of this patent is extended or adjusted under 35 U.S.C. 154(b) by 689 days.

(21) Appl. No.: 10/715,070

(22) Filed: Nov. 17, 2003

(65) Prior Publication Data
US 2004/0102207 A1    May 27, 2004

Related U.S. Application Data

(63) Continuation of application No. PCT/DE02/01016, filed on Mar. 20, 2002.

(30) Foreign Application Priority Data
May 17, 2001    (DE) .................. 101 24 179

(51) Int. Cl.
*H04K 1/02* (2006.01)
*H04L 25/03* (2006.01)
*H04L 25/49* (2006.01)

(52) U.S. Cl. ..................... 375/296; 375/345

(58) Field of Classification Search ......... 375/295–297, 375/354; 330/254, 278
See application file for complete search history.

(56) References Cited

U.S. PATENT DOCUMENTS

| 5,307,512 | A |   | 4/1994 | Mitzlaff |
| 5,369,789 | A | * | 11/1994 | Kosugi et al. ............... 455/126 |
| 5,708,681 | A |   | 1/1998 | Malkemes et al. |
| 5,778,307 | A |   | 7/1998 | Budnik |
| 5,990,755 | A |   | 11/1999 | Takaaki |
| 7,130,595 | B1 | * | 10/2006 | Mohindra ................ 455/127.1 |
| 2001/0000456 | A1 | * | 4/2001 | McGowan ................... 370/342 |
| 2001/0006888 | A1 | * | 7/2001 | Posti et al. .................... 455/69 |
| 2002/0168025 | A1 | * | 11/2002 | Schwent et al. ............. 375/297 |

FOREIGN PATENT DOCUMENTS

| DE | 42 91 711 C2 | 5/1994 |
| EP | 0 538 870 A2 | 4/1993 |
| EP | 692 30 607 T2 | 4/1993 |
| EP | 1 087 541 A2 | 3/2001 |
| GB | 2349522 A * | 11/2000 |
| WO | 01/47106 A2 | 6/2001 |

* cited by examiner

*Primary Examiner*—Curtis B Odom
(74) *Attorney, Agent, or Firm*—Laurence A. Greenberg; Werner H. Stemer; Ralph E. Locher

(57) ABSTRACT

In mobile radio receivers, the transmission power must be raised before the start of the transmission process, and must be reduced again after the end of the transmission process. Until now, the transmission power has been controlled exclusively by varying the gain of the power amplifier. The inventive concept is based on using a scaling unit to additionally scale the amplitudes of the baseband signals in order to assist the switching-on and switching-off processes.

20 Claims, 2 Drawing Sheets

DEVICE AND METHOD FOR REGULATING THE OUTPUT POWER OF MOBILE

CROSS-REFERENCE TO RELATED APPLICATION

This application is a continuation of copending International Application No. PCT/DE02/01016, filed Mar. 20, 2002, which designated the United States and was not published in English.

BACKGROUND OF THE INVENTION

Field of the Invention

The invention relates to a device for regulating the output power of radios, in particular mobile radios. The invention furthermore relates to a method for raising and reducing the transmission power of radios, in particular mobile radios.

One problem that arises when transmitting pulsed mobile radio transmission signals is that the transmission power must be raised within a specific time interval to its nominal value at the start of the transmission process before the data burst to be sent can be transmitted. Once the data burst has been transmitted, the transmission power must once again be reduced approximately to zero. In the process, the transmission power must not be switched on and off abruptly, because this would lead to an interference spectrum which, in particular, would cause major problems with the transmission quality on the adjacent channels. To this extent, the conventional mobile radio standards provide that the adjacent channel interference must not exceed a specified maximum level.

For this reason, the transmission power must be switched on and off continuously over a specific time interval in the form of a power ramp. This necessitates reliable control of the output power over a wide dynamic range. The required output power dynamic range is, for example, up to 48 dB. Furthermore, both a switching-on and a switching-off process are required for each data burst to be transmitted.

In the case of the GSM (global system for mobile communications) mobile radio system, which operates using the GMSK (Gaussian Minimum Shift Keying) modulation method, the described problem has been solved using complex circuitry for the power amplifier and for controlling the power amplifier. This meant that it was possible to comply with the required dynamic range with the required accuracy. However, with the EDGE extension to the GSM mobile radio system, the problem of reliably monitoring the output power has been raised in a more serious form since, in this case, both the phase and the amplitude information must be transmitted linearly by the output stage.

SUMMARY OF THE INVENTION

It is accordingly an object of the invention to provide a device and a method for monitoring the output power of radios, which overcome the above-mentioned disadvantages of the prior art apparatus and methods of this general type.

In particular, it is an object of the invention to provide a device and a method for monitoring the output power of radios, by which the switching-on and switching-off process for the transmission power of the radio can be monitored reliably over a wide dynamic range with little complexity.

With the foregoing and other objects in view there is provided, in accordance with the invention, a device for monitoring the output power of radios, in particular of mobile radios that includes at least one radio-frequency module which converts baseband transmission signals to the radio-frequency band, and amplifies them. The radio-frequency module itself includes a power amplifier with a controllable gain. In order to monitor the output power, the device additionally has a scaling unit for varying the signal amplitudes of the baseband transmission signals. Further, the device includes a controller, which, on raising or reducing the output power, before or after the transmission of a data burst, synchronizes the variation of the signal amplitudes of the baseband transmission signals by the scaling unit with the variation of the gain of the power amplifier.

Until now, the transmission power has been controlled exclusively by varying the gain factor of the power amplifier, however, the inventive concept includes introducing a second control capability for influencing the transmission power. A controller synchronizes the second control capability with the first control capability. Even before the baseband transmission signals are passed to the power amplifier that is arranged in the radio-frequency module, their signal amplitude can be influenced using the inventive scaling unit. The majority of the power control is also still carried out by varying the gain of the power amplifier. However, since a second control mechanism is also provided, which influences the amplitudes of the input signals, this reduces the dynamic range that needs to be coped with by each individual control mechanism. The attenuation of the signal amplitudes of the baseband transmission signals means that the power amplifier need itself provide control only over a narrower dynamic range. This reduces the circuit complexity for controlling the gain of the power amplifier.

The invention can also be used to increase the dynamic range that is available for the output power. This dynamic range is increased by the amount of the additional attenuation caused by the scaling unit. This makes it possible to effectively prevent crosstalk from the input signal to the output signal during the switching-on and switching-off process. Before the start of transmission of the data burst, the input signal is sufficiently well isolated from the output that no interference noise is transmitted. The same applies to the time interval after completion of the transmission process.

The invention allows the power amplifier isolation requirements with regard to the crosstalk from the input signal to the output signal to be reduced, to be precise by exactly the same amount as the attenuation of the baseband transmission signals using the scaling unit.

A further advantage of the inventive solution is that the control signal for controlling the gain of the power amplifier now covers only a narrower value range than in the past, since the power amplifier now need be controlled only over a narrower dynamic range than in the past. Interference which acts on the control signal thus becomes less important; and the robustness of the control is improved.

A further advantage is that the scaling unit can be implemented with little physical additional complexity. From the cost point of view as well, the solution is considerably more advantageous than any attempt to further widen the controllable dynamic range of the power amplifier by using complex circuitry.

It is advantageous for the scaling unit to have a multiplier for each baseband transmission signal. Each multiplier can scale the signal amplitude of the respective baseband signal. This means that it is possible to obtain any desired attenuation by multiplying the respective signal amplitude by the appropriate factor. This allows any required attenuation and any required attenuation profile to be provided in a flexible manner. A further advantage is that the scaling can be changed within very short time intervals using a multiplier.

It is particularly advantageous for the multipliers to be digital multipliers which are arranged upstream of the digital/analog converters in the signal path. In this embodiment of the invention, the scaling of the signal amplitude is not carried out in the power area of the circuit arrangement, but in the area in which the baseband signal is still in the form of a digital signal. In this area of the circuit, the signal amplitudes of the respective baseband signals can be influenced in a simple and cost-effective manner by the digital multipliers. Digital multipliers offer sufficient accuracy and speed for scaling the baseband signals while maintaining their phase.

It is advantageous for the device to have at least one baseband module which produces the baseband signals, and for the scaling unit to be arranged on the baseband module. Digital signal processing of the baseband signals is carried out on the baseband module. The baseband signal is then converted from digital to analog form, and is supplied to the radio-frequency module or modules. It is therefore possible to design the scaling unit using digital technology, and to integrate it on the baseband module. This also has the advantage that complex rising and decreasing amplitude profiles can be stored in digital form.

According to one advantageous embodiment of the invention, the baseband transmission signals include an in-phase and a quadrature signal. Signals are normally represented in the complex plane for mobile radio purposes. This means that a complex baseband transmission signal is represented by the real-value in-phase signal and a real-value quadrature signal.

The gain of the power amplifier is advantageously controllable by a power control device. Controllable power amplifiers such as these are known from the prior art and can advantageously be combined with the scaling unit. Two control mechanisms, which operate independently of one another, are therefore available in order to influence the output power. First, the output power can be influenced as before via the power control device for the power amplifier. In addition, the output power of the radio can be influenced by the scaling unit, which to this extent represents a second control mechanism. Since the two control mechanisms operate independently of one another, the dynamic range can be increased by combining the inventive amplitude scaling with the power control that is carried out in the power amplifier.

In this case, it is advantageous for the gain of the power amplifier to be readjusted by the power control device such that the actual transmission power in each case corresponds to a nominal value of the transmission power which is supplied to the power control device. The nominal value therefore does not predetermine the gain factor, but the desired actual transmission power, which can be represented as the product of the input signal amplitude and the gain factor of the power amplifier.

The actual power control device is implemented by a control loop in which the nominal value of the transmission power that is supplied is compared with the actually measured transmission power. The gain factor is then varied by the power control device depending on the error between the actual value and the nominal value, such that the actual transmission power is made to approach the nominal value. This automatically results in the signal amplitude of the input signal being taken into account: the gain factor is set such that the input signal level is raised to the output power determined by means of the nominal value. Since the desired output transmission power is predetermined as the nominal value, this allows the decreasing and raising of the output transmission power to be controlled in a very simple manner.

It is advantageous for the device to have a power measurement unit for determining the actual transmission power, which outputs and evaluates a fraction of the transmission power. A portion of the output transmission power is extracted directly at the antenna, is advantageously rectified, and represents a measurement of the actual output transmission power. The signal obtained in this way is used as the actual value for the power control loop described above. Since the power is detected directly at the antenna and not at some upstream point in the signal path, the actual value of the output transmission power can be determined appropriately. This improves the control accuracy.

The device advantageously has a power ramp generator for producing switching-on and switching-off ramps which have a continuous profile for the nominal value of the transmission power. Using a switching-on ramp with a continuous profile ensures that the output transmission power is raised continuously before the start of the transmission process, and is raised continuously from zero to the desired transmission power level. The switching-off ramp is used in a corresponding manner to decrease the transmission power continuously once again after completing the transmission process to approximately zero, thus avoiding abrupt changes in the output signal power. The extent of adjacent channel interference can thus be kept below the permissible limit value.

According to one advantageous embodiment of the invention, the power ramp generator is arranged on the module which contains the scaling unit. In this case, it is particularly advantageous to design both the scaling device and the power ramp generator using digital technology, and to integrate them on the baseband module. The power ramp generator in this embodiment of the invention produces a rising or falling digital signal that is converted by a digital/analog converter to an analog nominal value of the transmission power. This analog nominal value of the transmission power can then be supplied to the power control device for the power amplifier.

As an alternative to this, it would be possible to design both the power ramp generator and the scaling device using analog technology and to arrange them on the radio-frequency module. This would have the advantage that the digital/analog conversion of the digital nominal value signal could be avoided.

One advantageous embodiment of the invention provides for the scaling unit to have a memory for a sequence of rising or falling scaling values, by which means, a rising or falling profile of the amplitudes of the baseband transmission signals can be produced. These scaling values may, for example, be supplied successively as factors to the multipliers in the scaling unit. The baseband transmission signals which are applied to the multipliers can then be successively multiplied by the various successive scaling values, so that a rising or falling profile of the amplitudes of the baseband transmission signals can be produced. Instead of having to change the scaling abruptly, this allows an approximately continuous variation in the scaled signal amplitudes.

It is advantageous for the rising or falling profile for the baseband transmission signals to be initiated by trigger signals which are supplied to the scaling unit. For example, a first trigger signal can be provided which produces a rising profile of the amplitudes of the baseband transmission signals. In a corresponding way, a second trigger signal can be provided which initiates a falling profile of the amplitudes. There is therefore no need to transmit the entire sequence of rising or falling scaling values to the scaling unit. Instead of this, it is sufficient to transmit the corresponding trigger signal to the scaling unit, in response to which, the scaling unit can automatically produce the entire rising or falling amplitude profile. This simplifies the control of the scaling unit.

It is particularly advantageous for a trigger signal to be in each case transmitted to the scaling unit at a defined time in the switching-on and switching-off ramps, in which case, in particular, the time interval between the start of the switching-on or switching-off ramp and the trigger signal can be chosen freely. The nominal value of the transmission power is transmitted in the form of a switching-on or switching-off ramp to the power control device for the power amplifier. Let us consider the switching-on ramp first of all. The continuously increasing nominal value results in the gain factor of the power amplifier being increased more and more. A trigger signal is now transmitted at a defined time to the scaling unit, causing the scaling unit to continuously raise the amplitudes of the baseband transmission signals corresponding to the stored profile. The signal amplitude at the input of the power amplifier thus increases continuously, and the rise in the output power which is predetermined by the switching-on ramp can therefore be achieved without any significant further increase in the gain. The trigger signal thus activates the mechanism for scaling the signal amplitudes, with the time synchronization between the control of the gain factor on the one hand and the amplitude scale on the other hand being predetermined by the time interval between the start of the signal ramp and the trigger signal. Suitable time matching between the nominal value profile for the power control and the amplitude scaling makes it possible to choose an optimum relationship between the profile of the signal amplitude and the profile of the gain control.

When switching off the transmission power, a decreasing profile is predetermined for the nominal value of the transmission power using the switching-off ramp. The gain of the power amplifier is reduced continuously in a corresponding manner. A trigger signal is transmitted to the scaling unit at a defined time in the switching-off ramp, in response to which the scaling unit continuously reduces the amplitudes of the baseband transmission signals. In consequence, the transmission power is reduced further continuously, without any need for a significant further reduction in the gain for this purpose.

The invention is particularly suitable for use in mobile radio stations, since it can be implemented with little hardware complexity using digital technology. In particular, the invention is suitable for use in mobile radio stations in which the data is transmitted in accordance with one of the Standards GSM, EDGE, TIA-/EIA-136, UMTS or in accordance with partial combinations of these Standards. One common feature of the cited mobile radio standards is that the data is transmitted in the form of data bursts. To this extent, it is necessary for the cited standards for the transmission power to be raised before the start of the transmission of a data burst, and to be decreased again after completion of the transmission. For this reason, mobile radio stations which support one of the cited standards or partial combinations of these standards are suitable for using the inventive scaling of the baseband transmission signals.

With the foregoing and other objects in view there is also provided, in accordance with the invention, a method that is suitable for raising the transmission power of radios, in particular mobile radios that have at least one radio-frequency module converting baseband transmission signals to the radio-frequency band and amplifying them. The radio-frequency module includes a power amplifier with a controllable gain. Raising the transmission power is performed prior to the transmission of a data burst. While carrying out the method for raising the transmission power, a switching-on ramp is, in a first step, applied to a power control device for the transmission power such that the gain of the power amplifier raises. After a defined time on the switching-on ramp, the amplitudes on the baseband transmission signals are then increased continuously from a minimum value to a maximum value simultaneously with the profile of the switching-on ramp.

The method for raising the transmission power allows two different control mechanisms to be combined and to be synchronized such that an increase in the controllable dynamic range can be achieved overall. This also applies to the largely analogous method for decreasing the transmission power of mobile radios.

Other features which are considered as characteristic for the invention are set forth in the appended claims.

Although the invention is illustrated and described herein as embodied in a device and method for regulating the output power of mobile radio stations, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
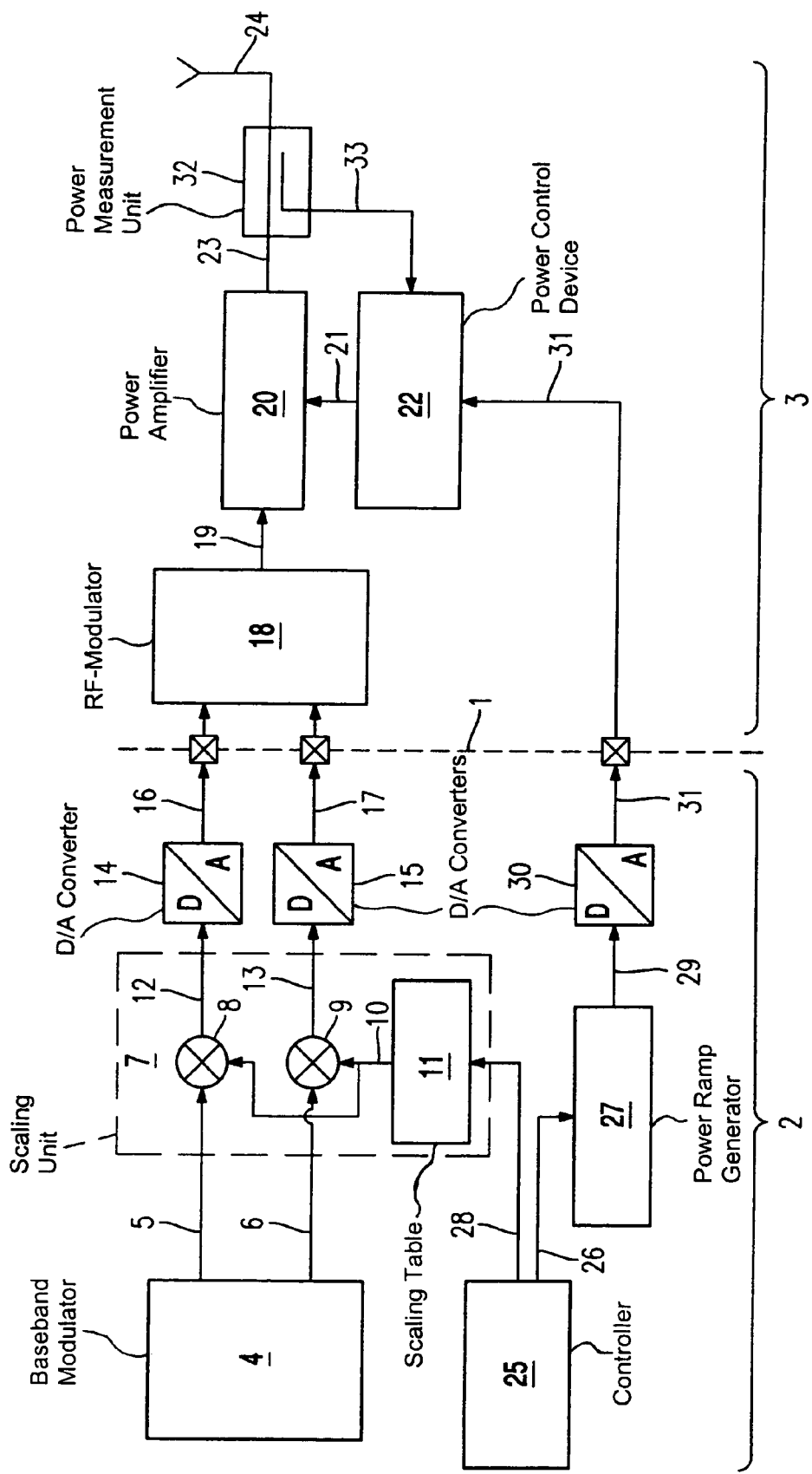
FIG. 1 is a block diagram of an inventive circuit configuration.

Referring now to the figures of the drawing in detail and first, particularly, to FIG. 1 thereof, there is shown a block diagram of a circuit arrangement. The functional units on the baseband side 2, that is to say to the left of the module boundary 1, are arranged on one or more baseband modules. The functional units on the radio-frequency side 3, that is to say to the right of the module boundary 1, are responsible for the radio-frequency signal processing; these functional units are integrated on one or more radio-frequency modules.

The baseband modulator 4 produces digital baseband signals, specifically a digital in-phase signal 5 and a digital quadrature signal 6, and transmits these to the IQ scaling unit 7. A multiplier 8 for the in-phase signal path, as well as a multiplier 9 for the quadrature signal path, are arranged in the IQ scaling unit 7. These multipliers are in the form of digital multipliers, with the scaling values 10 by which the in-phase signal 5 and the quadrature signal 6 are multiplied being provided by the IQ scaling table 11. The IQ scaling table 11 includes a digital memory for storage of at least one sequence of digital scaling values. The scaled digital in-phase signal 12 can be tapped off at the output of the multiplier 8, and is supplied to the digital/analog converter 14 where it is converted to the analog in-phase signal 16. In a corresponding manner, the scaled digital quadrature signal 13 is supplied to the digital/analog converter 15 and is converted to the analog quadrature signal 17. Both the analog in-phase signal 16 and the analog quadrature signal 17 are passed from the baseband side 2 to the radio-frequency side 3, where they are up-mixed by the radio-frequency modulator 18 to the radio-frequency band. The analog radio-frequency signal which is produced by the radio-frequency modulator 18 is used as an input signal 19 for the power amplifier 20. The gain factor of the power amplifier 20 is predetermined by the analog control signal 21 from the power control device 22. The amplified radio-frequency signal 23 which is produced at the output of the power amplifier 20 is supplied to the antenna 24, and is transmitted.

A controller 25 is provided on the baseband side 2 in order to control the switching-on and switching-off processes, and produces on the one hand the control signals 26 for the power ramp generator 27 and, on the other hand, the trigger signals 28 for the IQ scaling unit 7. The IQ scaling unit 7 and the power ramp generator 27 can be activated, deactivated and configured by the controller 25. The control signals 26 cause the power ramp generator 27 to produce a switching-on or a switching-off ramp for the transmission power. The digital power ramp signal 29 is converted by the digital/analog converter 30 to the analog power ramp signal 31, which is transmitted from the baseband side 2 to the radio-frequency side 3.

The analog power ramp signal 31 is supplied to the power control device 22, and is used to predetermine the nominal value for the output transmission power of the mobile station. The actual value of the output transmission power is detected in the power measurement unit 32 by extracting a fraction of the radio-frequency transmission signal and, in particular, rectifying it. The power measurement signal 33 which is emitted from the power measurement unit 32 represents a measure of the output transmission power which actually occurs at the antenna 24, that is to say the actual value of the transmission power, and is supplied to the power control device 22.

The power control device 22 is in the form of a control loop. In order to produce the control signal 21 for the power amplifier 20, a comparison is carried out continuously between the analog power ramp signal 31 that is used as the nominal value, and the power measurement signal 33 which represents the actual value. When the nominal value which is predetermined by the power ramp signal 31 is higher than the actual value, then the control signal 21 is readjusted such that the gain of the power amplifier 20 is increased. Conversely, when the actual value of the transmission power as indicated by the power measurement signal 33 is greater than the nominal value represented by the analog power ramp signal 31, then the output transmission power is reduced. This is done by decreasing the gain factor of the power amplifier 20.

The use of this power control loop ensures that the output transmission power always follows the profile predetermined by the power ramp signal. The described control loop means that this can always be ensured irrespective of the signal amplitude of the input signal 19.

In order to produce a switching-on ramp, a trigger signal 28 is transmitted to the IQ scaling unit 7 at a specific time interval from the control signal 26 which causes the power ramp generator 27 to produce the switching-on ramp, and this trigger signal 28 assists the switching-on process by producing a rising profile of the scaling values 10 for the baseband transmission signals. The rising sequence of scaling values 10 is stored in the IQ scaling table 11. The scaling values are read successively and are transmitted to the multipliers 8 and 9 in order that the digital in-phase signal 5 and the digital quadrature signal 6 can be multiplied by these factors. This results in the scaled digital signals 12 and 13 having a rising profile, thus assisting the switching-on process. The scaling of the IQ signals should have a continuous profile, which can be differentiated, over the entire profile and in particular at the start and end of the IQ ramp, in order to prevent the power amplifier control from having to smooth out abrupt discontinuities.

When, on the other hand, a control signal 26 which causes the production of a switching-off ramp is transmitted to the power ramp generator 27, then a trigger signal 28 which triggers a falling profile of the scaling for the baseband transmission signals is transmitted to the IQ scaling unit 7 at a specific time interval from this control signal 26. This is done by reading a falling sequence of scaling values from the IQ scaling table 11, and transmitting these to the multipliers 8 and 9. The decreasing sequence of scaling values can be stored as a separate sequence of scaling data. However, the decreasing sequence of scaling values can also be produced by reading the rising sequence of scaling values that are used in conjunction with the switching-on ramp in the opposite sequence.

Figure 2A:
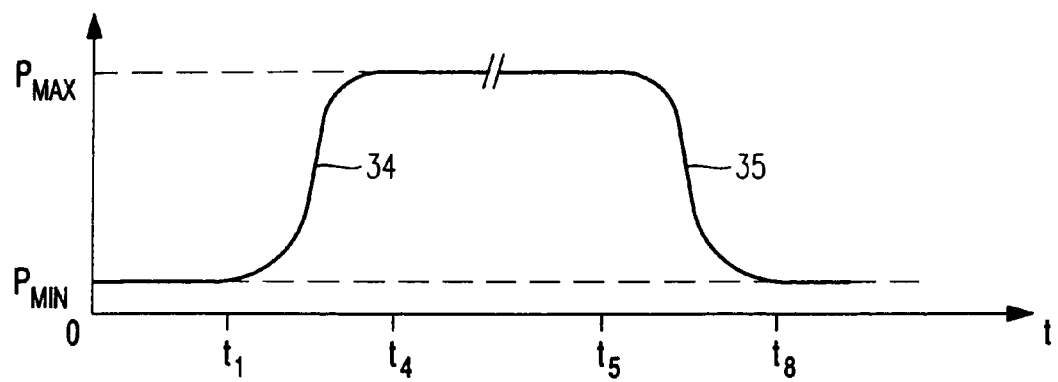
FIG. 2A is a graph showing the time profile of the switching-on and switching-off ramp for the transmission power.
Figure 2B:
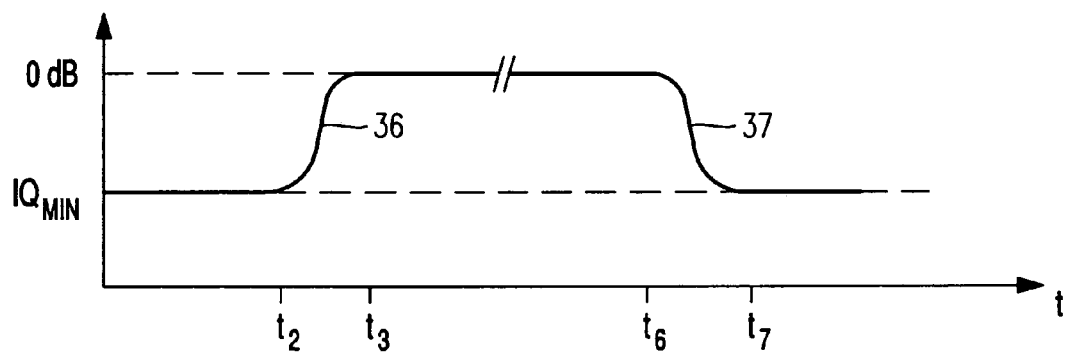
FIG. 2B is a graph showing the amplitude profile of the baseband transmission signals during the switching-on and switching-off processes.
Figure 2C:
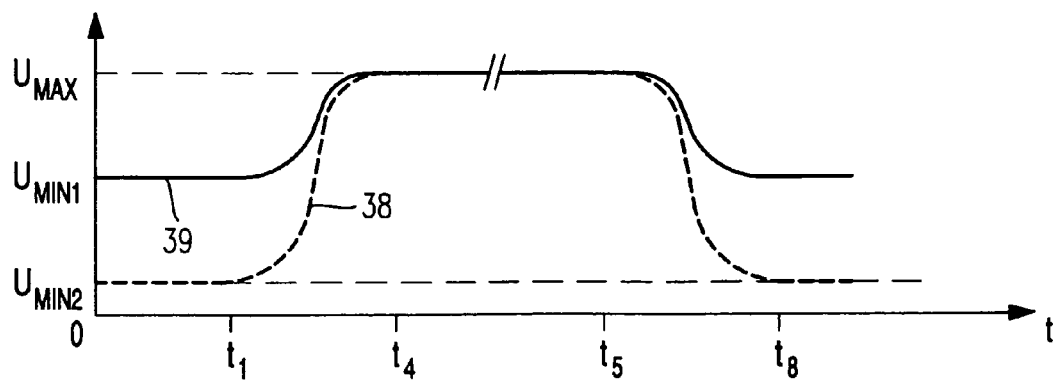
FIG. 2C is a graph showing the time profile of the control signal for the power amplifier while raising and decreasing the transmission power.

FIGS. 2A to 2C show the time profiles of the various signals which are required to produce a switching-on ramp and a switching-off ramp. FIG. 2A shows the output power of the power amplifier as a function of time, showing the time profile of a switching-on ramp 34 followed by a switching-off ramp 35. The profile of the switching-on and the switching-off ramp is predetermined by the analog power ramp signal 31, whose time profile therefore in principle corresponds to the illustrated profile of the output power.

The time $t_1$ marks the start of the switching-on ramp 34. This leads to a rise in the output power of the power amplifier from the minimum output power $P_{MIN}$ to the maximum output power $P_{MAX}$. The power ramp reaches its maximum after a fixed elapsed time at the time $t_4$.

The switching-off ramp 35 starts at the time $t_5$. This is then followed by a decrease in the output value from the value $P_{MAX}$ (the maximum output power) to the value $P_{MIN}$ (the minimum output power). The power ramp reaches the minimum after a fixed elapsed time at the time $t_8$.

FIG. 2B shows the associated time profile of the power for the complex baseband signal. The power for the complex baseband signal can be derived from the scaled analog in-phase signal 16 and from the scaled analog quadrature signal 17. To this extent, the profile illustrated in FIG. 2B shows the scaling of the baseband transmission signals by the IQ scaling unit 7. Initially, the output power is at its minimum value, and the power of the complex baseband signal is also scaled down to a minimum value. The illustrated value $IQ_{MIN}$ indicates the minimum value of the power of the complex baseband signal relative to the maximum value. After the time $t_1$, at which the switching-on ramp is activated, a time interval that can be defined as required starts to run in the controller 25. Once this time interval has elapsed, at the time $t_2$, a trigger signal 28 is transmitted to the IQ scaling unit 7, which activates the IQ scaling rise 36 for the switching-on ramp. The IQ scaling reaches its maximum after a fixed elapsed time at the time $t_3$.

In a corresponding way, the IQ scaling decrease 37 for the switching-off ramp is activated at the time $t_6$, which occurs at a time interval which can be chosen freely after the time $t_5$. This is once again done using a trigger signal 28. The scaling of the baseband transmission signals once again reaches the minimum $IQ_{MIN}$ after a fixed elapsed time at the time $t_7$.

FIG. 2C shows the time profile of the analog control signal 21 that is used to adjust the gain factor of the power amplifier 20. The signal profile 38, which is shown as a dashed line, relates to the situation where the amplitudes of the in-phase signal 16 and of the quadrature signal 17 are constant—this is the situation corresponding to the prior art. Without the inventive IQ scaling, the gain factor of the power amplifier 20 must be varied over a wide dynamic range, and the control signal 21 therefore also has to pass over a wide voltage range from the minimum voltage $U_{MIN2}$ UP to the maximum voltage $U_{MAX}$ and back to the minimum voltage $U_{MIN2}$.

The signal profile 39, which is shown as a solid line, indicates the profile of the control signal 21 when using the IQ scaling. Since the analog in-phase signal 16 as well as the analog quadrature signal 17 are scaled in accordance with the profile shown in FIG. 2B, the gain factor of the power amplifier 20 during the switching-on and switching-off processes need be varied to a lesser extent than was the case with the prior art. The control signal 21 for the power amplifier therefore also covers a narrower value range, which extends from the minimum voltage $U_{MIN1}$ to the maximum voltage $U_{MAX}$.

The use of the IQ scaling according to the invention therefore results in the gain factor of the power amplifier 20 needing to be changed to a considerably lesser extent than in the past in order to achieve a predetermined transmission power dynamic range. Conversely, the use of the scaling of the signal amplitudes of the in-phase and quadrature signals allows the dynamic range of the output transmission power to be widened in comparison to the prior art.

We claim:

1. A device for monitoring an output power of a radio, the device comprising:
   at least one radio-frequency module for converting baseband transmission signals having signal amplitudes to radio-frequency signals and for amplifying said radio-frequency signals, said radio-frequency module including a power amplifier having a controllable gain;
   a scaling unit for varying said signal amplitudes of said baseband transmission signals, said scaling unit including a memory for storing a sequence of rising or falling amplitude values;
   said sequence of amplitude values producing a rising or falling profile for said signal amplitudes of said baseband transmission signals;
   a controller for controlling said scaling unit and for synchronizing said varying of said signal amplitudes of said baseband transmission signals by said scaling unit with a variation of said gain of said power amplifier when raising or reducing an output power before or after transmitting a data burst; and
   an analog power control device for controlling said power amplifier, said analog power control device being separate from said controller.

2. The device according to claim 1, wherein:
   said scaling unit includes a first multiplier for scaling a signal amplitude of a first one of said baseband transmission signals; and
   said scaling unit includes a second multiplier for scaling a signal amplitude of a second one of said baseband transmission signals.

3. The device according to claim 2, further comprising:
   a first signal path including a digital/analog converter and said first multiplier; and
   a second signal path including a digital/analog converter and said second multiplier;
   said first multiplier being a digital multiplier configured upstream of said digital/analog converter in said first signal path; and
   said second multiplier being a digital multiplier configured upstream of said digital/analog converter in said second signal path.

4. The device according to claim 1, further comprising:
   at least one baseband module for producing baseband transmission signals;
   said scaling unit configured in said baseband module.

5. The device according to claim 1, wherein said baseband transmission signals include an in-phase signal and a quadrature signal.

6. The device according to claim 1, wherein said analog power control device controls said gain of said power amplifier.

7. The device according to claim 6, wherein:
   said analog power control device is supplied with a nominal value of a transmission power; and
   said analog power control device readjusts said gain of said power amplifier such that an actual transmission power in each case corresponds to said nominal value of said transmission power being supplied to said power control device.

8. The device according to claim 1, further comprising:
   a power measurement unit for determining an actual transmission power;
   said power measurement unit evaluating a fraction of said transmission power.

9. The device according to claim 1, further comprising:
   a power ramp generator for producing continuous switching-on and switching-off ramps for a nominal value of a transmission power;
   said analog power control device being supplied with said nominal value of said transmission power; and
   said analog power control device readjusting said gain of said power amplifier such that an actual transmission power corresponds to said nominal value of said transmission power being supplied to said analog power control device.

10. The device according to claim 9, further comprising:
    at least one baseband module for producing baseband transmission signals;
    said scaling unit configured in said baseband module; and
    said power ramp generator configured in said baseband module.

11. The device according to claim 1, wherein:
    said scaling unit is configured for obtaining trigger signals for initiating said rising or falling profile for said signal amplitudes of said baseband transmission signals.

12. The device according to claim 1, wherein:
    during a switching-on ramp, said scaling unit obtains a trigger signal at a chosen time interval after a beginning of the switching-on ramp; and
    during a switching-off ramp, said scaling unit obtains a trigger signal at a chosen time interval after a beginning of the switching-off ramp.

13. A mobile radio station including a device for monitoring an output power of a radio, the device comprising:
    at least one radio-frequency module for converting baseband transmission signals having signal amplitudes to radio-frequency signals and for amplifying said radio-frequency signals, said radio-frequency module including a power amplifier having a controllable gain;
    a scaling unit for varying said signal amplitudes of said baseband transmission signals, said scaling unit including a memory for storing a sequence of rising or falling amplitude values;
    said sequence of amplitude values producing a rising or falling profile for said signal amplitudes of said baseband transmission signals;
    a controller for controlling said scaling unit and for synchronizing said varying of said signal amplitudes of said baseband transmission signals by said scaling unit with a variation of said gain of said power amplifier when raising or reducing an output power before or after transmitting a data burst; and an analog power control device for controlling said power amplifier, said analog power control device being separate from said controller.

14. The mobile radio station according to claim 13, wherein said data burst is transmitted in accordance with at least one standard selected from a group consisting of GSM, EDGE, TIA-/EIA-136, UTRA-TDD, and UNTS.

15. A method for raising a transmission power of a radio having at least one radio-frequency module for converting baseband transmission signals to radio-frequency band signals and a power amplifier with a controllable gain for amplifying the radio-frequency band signals, the method which comprises, prior to transmitting a data burst:
   applying a switching-on ramp to a power control device to raise the gain of the power amplifier and thereby increase a transmission power; and
   starting at a defined time on the switching-on ramp, continuously increasing amplitudes of the baseband transmission signals from a minimum value to a maximum value while the switching-on ramp is simultaneously increasing.

16. The method according to claim 15, which further comprises: performing the applying and the starting step in a mobile radio.

17. A method for reducing a transmission power of a radio having at least one radio-frequency module for converting baseband transmission signals to radio-frequency band signals and a power amplifier with a controllable gain for amplifying the radio-frequency band signals, the method which comprises, prior to transmitting a data burst:
   applying a switching-off ramp to a power control device to decrease the gain of the power amplifier and thereby decrease a transmission power; and
   starting at a defined time on the switching-off ramp, continuously reducing amplitudes of the baseband transmission signals from a maximum value to a minimum value while the switching-off ramp is simultaneously decreasing.

18. The method according to claim 17, which further comprises: performing the applying and the starting step in a mobile radio.

19. A device for raising a transmission power of a radio, comprising:
   at least one radio-frequency module for converting baseband transmission signals to radio-frequency band signals;
   a scaling unit for varying amplitudes of the baseband transmission signals;
   a power amplifier with a controllable gain for amplifying the radio-frequency band signals;
   a power control device for controlling the gain of said power amplifier; and
   a power ramp generator for producing continuous switching-on ramps, the switching-on ramps being applied to said power control device for raising the gain of said power amplifier and thereby increasing the transmission power, and starting at a defined time on a switching-on ramp, amplitudes of the baseband transmission signals being increased by said scaling unit from a minimum value to a maximum value while the switching-on ramp is simultaneously increasing.

20. A device far reducing a transmission power of a radio, comprising:
   at least one radio-frequency module for converting baseband transmission signals to radio-frequency band signals;
   a scaling unit for varying amplitudes of the baseband transmission signals;
   a power amplifier with a controllable gain for amplifying the radio-frequency band signals;
   a power control device for controlling the gain of said power amplifier; and
   a power ramp generator for producing continuous switching-off ramps, the switching-off ramps being applied to said power control device for decreasing the gain of said power amplifier and thereby decreasing the transmission power, and starting at a defined time on a switching-off ramp, amplitudes of the baseband transmission signals being reduced by said scaling unit from a maximum value to a minimum value while the switching-off ramp is simultaneously decreasing.

* * * * *